United States Patent [19]
Schar

[11] Patent Number: 5,842,273
[45] Date of Patent: Dec. 1, 1998

[54] METHOD OF FORMING ELECTRICAL INTERCONNECTS USING ISOTROPIC CONDUCTIVE ADHESIVES AND CONNECTIONS FORMED THEREBY

[75] Inventor: Wayne C. Schar, Portola Valley, Calif.

[73] Assignee: Hewlett-Packard Company, Palo Alto, Calif.

[21] Appl. No.: 592,042

[22] Filed: Jan. 26, 1996

[51] Int. Cl.[6] .................................................. H05K 3/36
[52] U.S. Cl. ........................... 29/830; 29/840; 152/297; 152/298; 152/299
[58] Field of Search ................... 29/840, 830; 156/297, 156/298, 299

[56] References Cited

U.S. PATENT DOCUMENTS

| | | |
|---|---|---|
| 4,588,456 | 5/1986 | Dery et al. . |
| 4,642,421 | 2/1987 | Dery et al. . |
| 4,729,809 | 3/1988 | Dery et al. . |
| 5,068,714 | 11/1991 | Seipler . |
| 5,221,417 | 6/1993 | Basavanhally . |
| 5,225,966 | 7/1993 | Basavanhally et al. . |
| 5,258,577 | 11/1993 | Clements . |
| 5,304,460 | 4/1994 | Fulton et al. . |
| 5,397,685 | 3/1995 | Daniels et al. ........................... 430/325 |
| 5,616,206 | 4/1997 | Sakatsu et al. . |
| 5,637,176 | 6/1997 | Gilleo ................................. 156/298 X |

FOREIGN PATENT DOCUMENTS

| | | |
|---|---|---|
| 0 424 106 A2 | 4/1991 | European Pat. Off. .......... H01R 9/09 |
| 0 501 270 A1 | 9/1992 | European Pat. Off. .......... H01B 1/22 |
| 4130637 | 4/1992 | Germany . |
| 03112011 | 5/1991 | Japan . |
| 6275678 | 9/1994 | Japan . |

OTHER PUBLICATIONS

Buchoff, LS, "Elastomeric Connectors or Land Grid Array Packages", Connection Technology, pp. 15–18, Apr. 1989.
Blodgett, AJ, "Microelectronic Packaging", Scientific American, v.249, No. 1, pp. 86–96, 1983.

*Primary Examiner*—Carl J. Arbes

[57] ABSTRACT

A method for compliant conductive interconnect whereby conductive adhesive is dispensed directly onto conductive sites of a first substrate and, while adhesive is wet or with partial or complete curing, a second substrate is aligned and placed in contact with adhesive deposits, thereby completing the interconnect. After assembly, un-filled underfill shrinks sufficiently to compress compliant adhesive and external clamping is largely eliminated. The method is scalable as low as about 6 mils with no real upper limit according to the percentage conductive particles by volume in the adhesive.

10 Claims, 4 Drawing Sheets

METHOD OF FORMING ELECTRICAL INTERCONNECTS USING ISOTROPIC CONDUCTIVE ADHESIVES AND CONNECTIONS FORMED THEREBY

FIELD OF INVENTION

This invention relates to the field of electronic interconnections in general and more specifically to a method of forming electronic interconnections and devices formed thereby.

BACKGROUND

Computer hardware systems use printed circuit boards upon which are mounted components. Components are, predominantly, integrated circuit chips (ICs) usually in some level of intermediate packaging.

As miniaturization of electronic components continues, there is a trend to create larger and larger printed circuit board (PCB) panels. Therefore, techniques are sought by which reliable electronic interconnections are formed for a high density of contact sites and across a large surface area.

Large surface areas present obstacles which are not a barrier in smaller packages. Intermediate packaging, that is to say, packaging layers that sit between the bare chip and the printed circuit board, have been used. Intermediate layers solve some challenges but create others. One problem with intermediate layers is the difficulty in establishing reliable connection between the intermediate layers and the PCB; and with the chip or chip and carrier. (Generalized representation in FIG. 1).

Pin connections are used to connect interposer layers. However, for high frequency applications, pin connections between the intermediate packaging and the circuit board are unsuitable because of high inductance and capacitance coupling owing to longer pin length. Connections that do not require leads (pins) have been and continue to be eagerly sought after.

Elastomeric connections (interposer connectors) were developed in an attempt to overcome the problem associated with pins or leads and intermediate packaging layers. Interposer connectors generally comprise conductive particles embedded in elastomeric materials. The particles extend through the elastomeric layer and, when the elastomeric layer is sandwiched between the two outer layers consisting of substrate (circuit board) and intermediate packaging, the two outer layers are electrically connected.

However, methods of forming the interposer have been limited to preparing the substrate with known methods such as sputtering or plating gold or nickel-silver to provide a surface for ball-bonding (depositing solder balls on one substrate surface and then assembling the two substrates). Alternatively, thermal compression bonding, laser bonding or automatic wire bonding have all been practiced. But none is recognized as a truly superior connection device.

Wire bond studs at a 10 mil pitch have been dipped into conductive adhesive and then pressed against substrate to form a "leadless" interconnect. The resulting interconnect has a small footprint and promotes effective and easy underfilling. A ball grid array formed by such a method results in an array that is both replaceable and testable, and which eliminates coplanarity problems, even in large BGAs. However, a carrier is still required. Moreover, wire bonding to get the studs is a slow process and can be prohibitively slow for high volume applications. For example, a high I/O application may require 900 I/O, and at a rate of three bonds per second, wire bonding alone consumes five minutes per chip. In addition, repair is completely impossible short of chiseling the chip off the substrate.

Some socket-like solutions proved suitable mounting for Land Grid Array packages and can be attached to substrates with large CTE mismatch (the well-known Cinch "Cinapse fuzzbutton", roughly similar to steel wool stuffed into a hole, and a lesser known AMP socket system utilizing conductive gel in sockets).

Gel connectors (see, for example, U.S. Pat. No. 5,074,799) provide a high number of contacts and dense planar array. Gel connectors are especially attractive because gel dissipates forces impinging on the contacts. Gel also ameliorates the challenge of CTE mismatch.

It has been shown that a wafer of conductive gel may be compressed between a BGA or LGA and a printed circuit board. While the AMP approach provides several advantages over that of the Cinapse "fizz-button", both are basically "socket" approaches and both fail to provide complete solutions to certain key design challenges such as the reduction of large external forces as components increase in surface area. A method that provides for elimination of sockets is desirable; a short and compliant structure is much needed.

Further, what is still needed is the elimination of the interposer/socket requirement altogether, along with the elimination of external clamping forces. A method is needed for providing effective electronic interconnect over large CTE mismatch and large DNPs, along with tolerance to coplanarity mismatches, where such an interconnect is thermal cycle resistant. Further, the interconnect must be amenable to easy test and repair, ideally both during assembly and in the field. Furthermore, the method ought to be lead-free and no-clean.

SUMMARY OF THE INVENTION

The invention taught herein relates to use of conductive adhesive, typically silicone with greater than 30% conductive particles by volume or similar adhesives, dispensed onto the conductive sites (wettable pads) of a substrate including chip or die followed by alignment with the conductive sites of a second substrate and assembly (attachment to another substrate) so as to provide, upon assembly of the two substrates, effective electronic interconnection of the two substrates. The invention further provides effective electronic interconnection over large CTE mismatch and large DNP. The invention further provides electronic interconnects that are thermal cycle resistant. The invention provides an interconnect path that supports high frequency operation, and is easy to test and repair. The invention provides tolerance to coplanarity mismatch. Further, the invention provides an assembly process that is lead-free and no-clean. Dispensing of the adhesive may be through stencil technique, other masking, including photoimageable or photostrippable, or through pin-transfer and related techniques. In addition, the invention provides easy IC chip attach to virtually any substrate, including PCB, die, or carrier. Such attach may, according to the present invention, involve assembly with wet or partially to fully cured adhesive, easy repair and testing prior to final cure, along with a variety of post-assembly curing and underfill options. Field testing and repair in devices according to the present invention is both rapid and uncomplicated.

DETAILED DESCRIPTION OF THE INVENTION

The invention taught herein provides short, compliant interconnects providing capabilities of elastic contact (through the use of conductive adhesive) without the need for sockets or other interposers. The invention provides capabilities for direct dispensing of the interconnect directly onto a carrier or onto the LGA or printed circuit board. Assembly between any two substrates may be performed when the interconnect material is wet, partially cured, or fully cured. After assembly, curing and underfilling may be done.

The invention as described includes grid array (circuit) components, and printed circuits adapted to accommodate large numbers of such components as well as interconnection providing circuit function between computers and related devices. The inventive method is scalable, useful not only for pitches at about 6 ml, but also scalable to much larger feature sizes.

The invention provides for assembly with low to no external pressure during and after the assembly in order for the interconnect to function. The invention provides for a flexible, scalable adhesive dispensing and substrate assembly protocol adaptable to the functionality characteristics required of the conductive device. The conductive adhesive can be uncured, partially or wholly cured. If attached to second substrate while uncured or partially cured, testing and repair can be performed at all stages prior to final and complete curing.

If assembled with no cure, the invention provides that "wet" assembly may be followed by cure. The inventive method provides a two-sided, flexible adhesive contact. Assembly when wet necessitates control of pressure and/or mechanical limiters to control spread of wet elastomer (especially with respect to contact between wet adhesive and adjacent conductors). In that method option, height limiting or spacer spheres or devices could be incorporated into the adhesive. This "wet" approach is for more mature products where repair is not particularly important.

Figure 1:
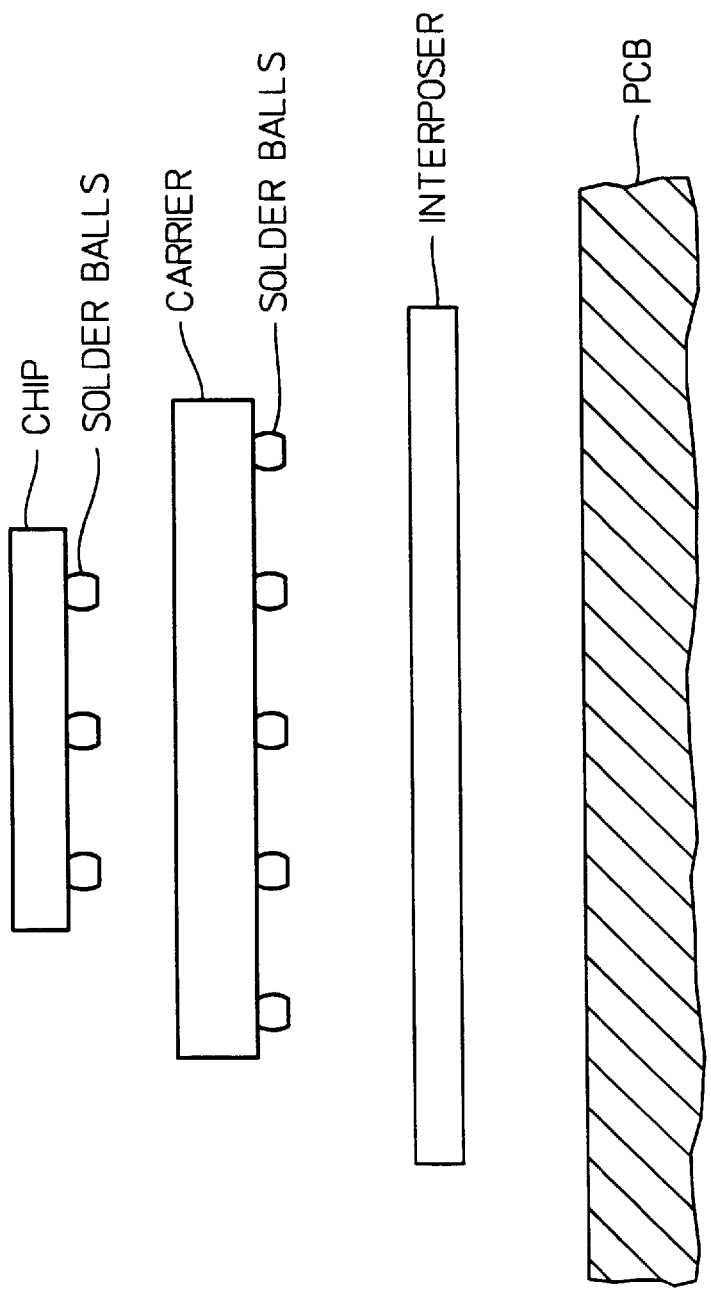
FIG. 1 is a schematic illustrating generalized prior art chip attached to PCB.
Figure 2:
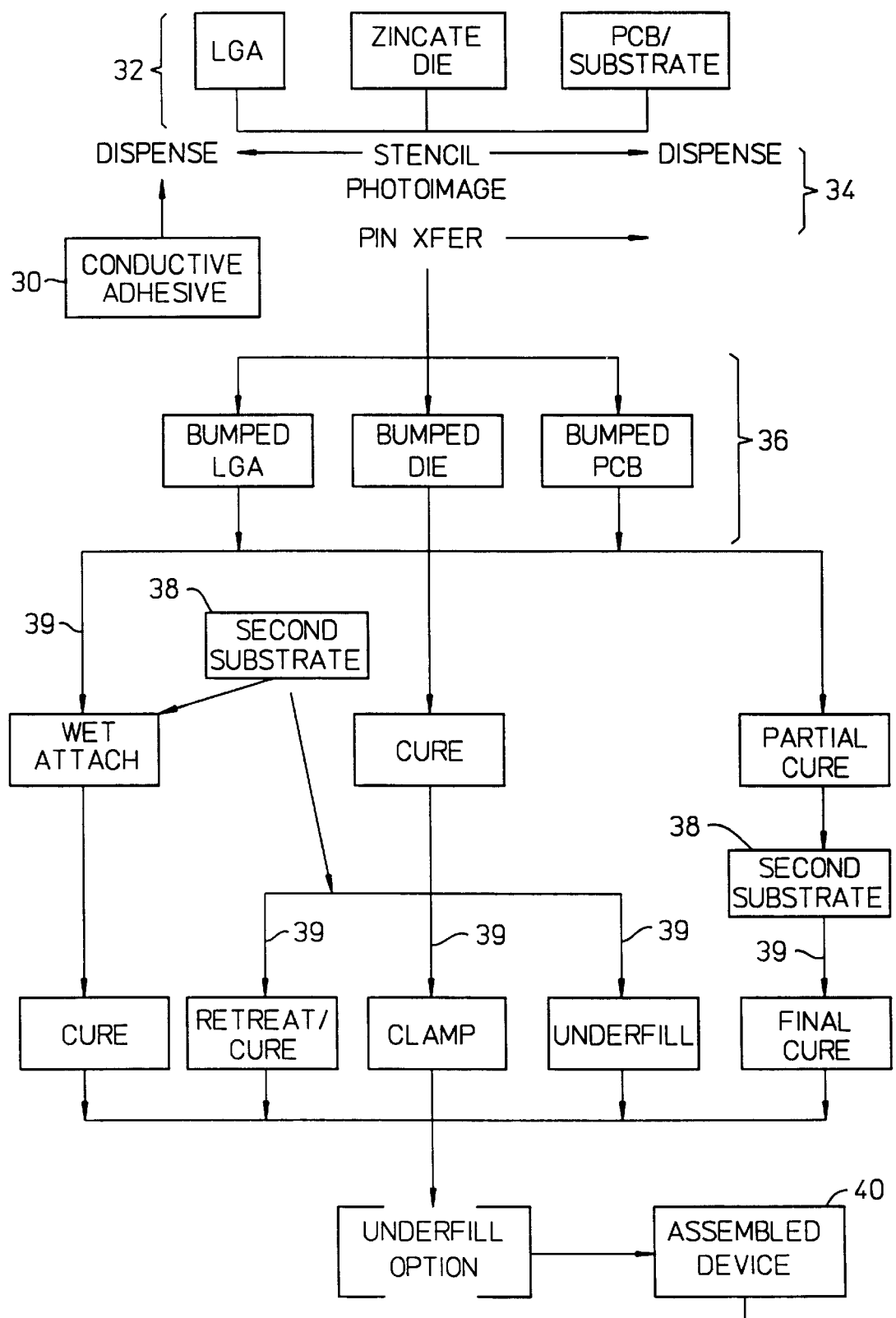
FIG. 2 is a schematic of the method according to the present invention.

As shown in FIG. 2, the method employs a conductive adhesive 30, and a first substrate 32. The adhesive is dispensed 34 on a surface of the first substrate 32, resulting in deposits of adhesive at predetermined regions on a surface of the first substrate—the first substrate bearing dispensed conductive adhesive 36. A second substrate 38 is attached 39 to the first substrate bearing dispensed conductive adhesive 36 thereby forming an interconnected device 40 consisting of two substrates and a compliant conductive interconnect.

The attach 39 step may be performed when the adhesive is wet, partially cured, or fully cured, depending on the desired connect characteristics or the scheme for attaching multiple chips to a comparatively large substrate such as a PCB. Post assembly protocols 42 for testing and repair (prior to final curing) as well as a variety of underfilling protocols are provided by the present invention.

Figure 3A:
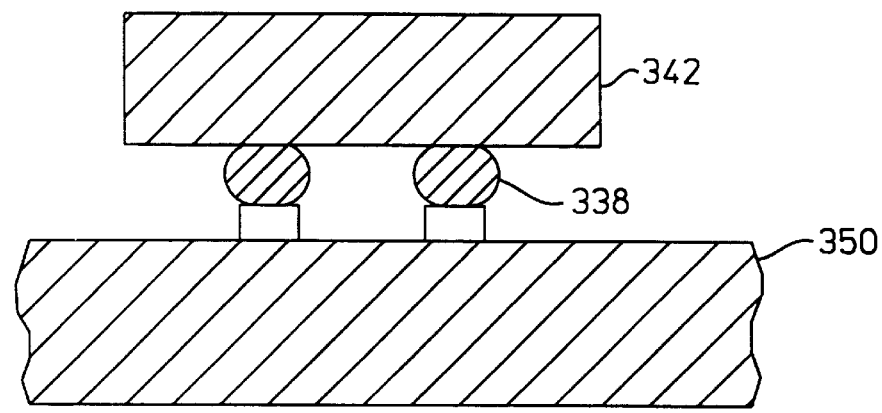
FIG. 3, A through C inclusive, schematically depict steps of one embodiment of the inventive method taught herein, most particularly that of underfilling interconnect assemblage.
Figure 3B:
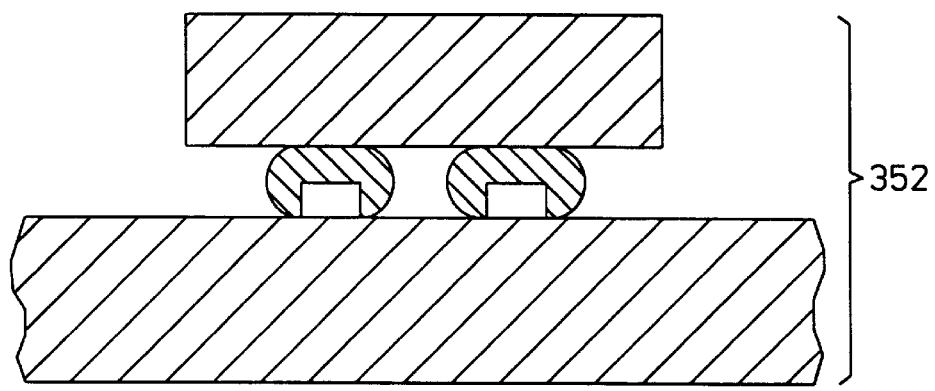
Figure 3C:
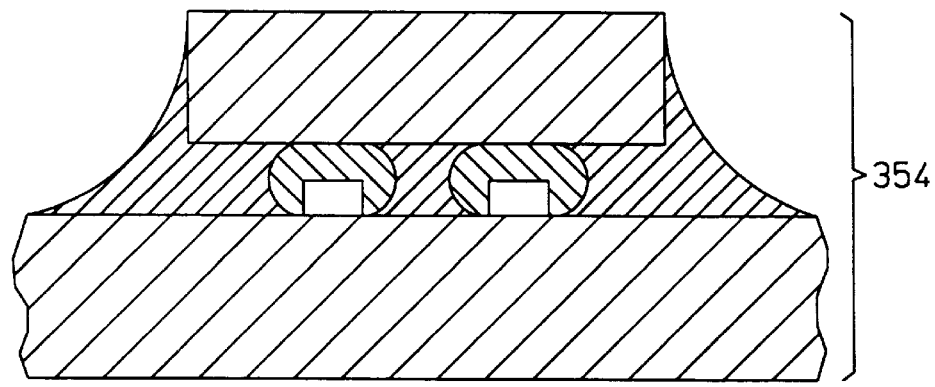

Suitable adhesives include those which are soft enough to be compressed by the internal forces from "underfilled" or pure underfill (see the discussion relating to FIG. 3 infra). A suitable adhesive includes any member of the family of silicone adhesives or soft epoxies and similar compounds into which has been mixed conductive particles, flakes or wires (gold, carbon, silver, etc). While the isotropic nature of the adhesive connection simplifies the contact, the volume of conductive particles in the adhesive should not except in exceptional circumstances fall below 30%. More typical is 45 to 75% by volume conductive particles. Practical factors such as the preservation of compliance will suggest to the practitioner the appropriate volume.

The compliance of the adhesive is the key factor in eliminating any need for external clamping. Selection of both adhesive and underfill should be considered with this in mind.

Dispensing 34 of adhesive 30 may be accomplished by a variety of methods. Stenciling through a preconfigured mask, or though strippable or peelable photoimageable mask material, as well as other known stenciling methods may be selected.

Figure 4:
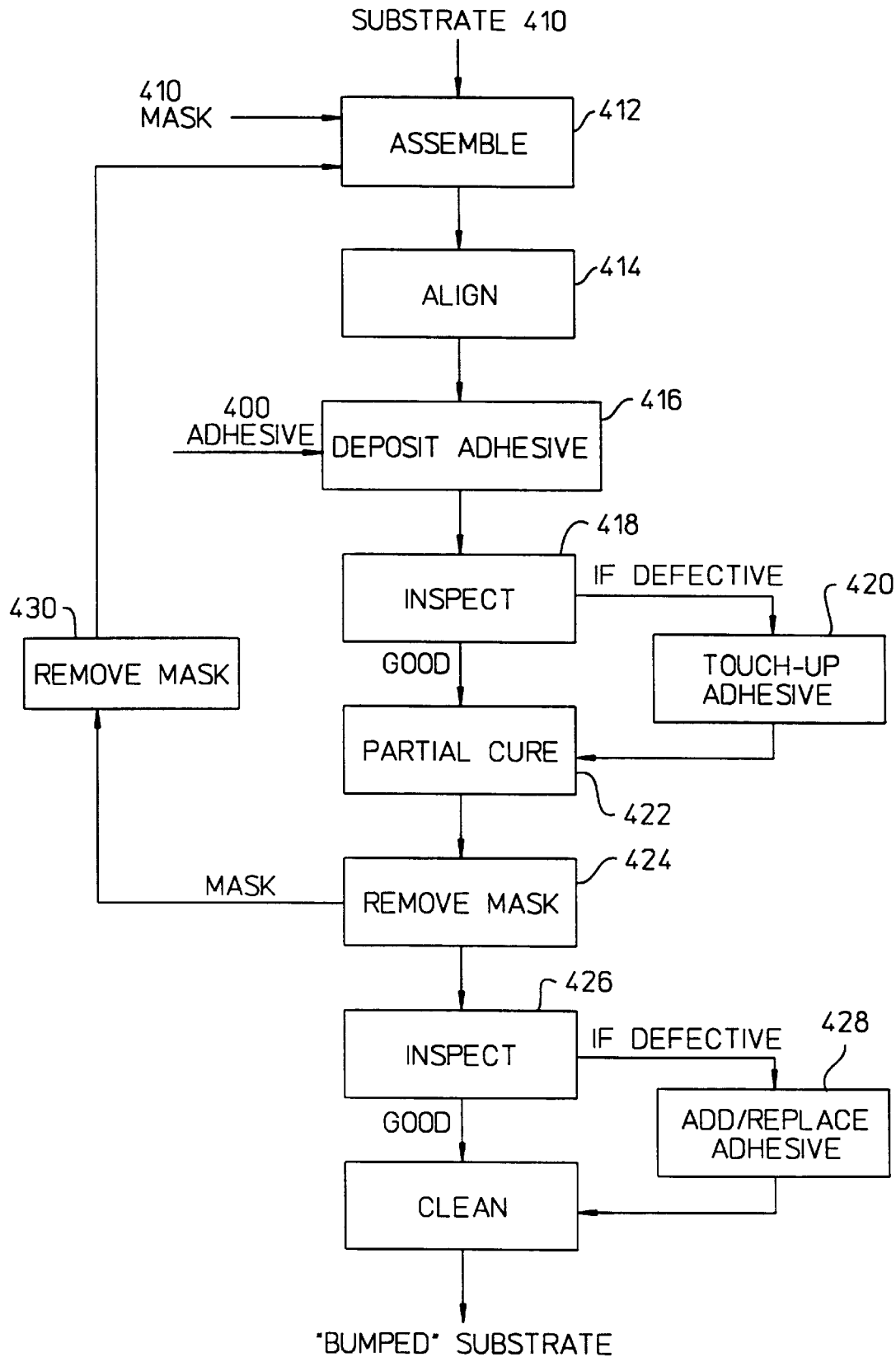
FIG. 4 is a flow chart depicting steps of one embodiment of the present invention.

As schematically outlined in FIG. 4, micro stenciling of the adhesive through mask apertures onto either of the two substrates to be connected is a highly desirable dispensing protocol. A proprietary Hewlett-Packard Company method termed CPD (contained paste deposition) (set forth in application Ser. No. 08/287,453 before the USPTO and incorporated as if fully set forth herein) provides for effective "micro-stenciling" of substances. As taught herein, micro stenciling of conductive adhesive onto a substrate's conductive sites provides for compliant electronic interconnects without the need for external force during operation of the device.

As outlined in FIG. 4, micro-stencil dispensing of the conductive adhesive according to the inventive method generally includes the steps 410 of selecting a first substrate, mask and adhesive; assembling 412 the substrate and mask; aligning 414 the substrate-mask, depositing 416 the conductive adhesive, removing 424 the mask; cleaning 430 the mask; and, possibly, reusing the mask in another repetition of the process. Other embodiments eliminate the step of mask removal 424; still others include intermediate inspection 418, 426 and touch-up 420, 428 steps to ensure the regular volume of conductive adhesive and proper placement.

Alternatively, the dispensing may be accomplished by "doctor-blading" or by pin-point transfer. In "pin transfer" pins, needles or the like are dipped in adhesive and then the pin point is placed in contact with the substrate surface upon which the adhesive is intended to be deposited. The contact causes a dollop or footprint of adhesive to be transferred to the substrate. Rather than use a studded die at each site it is simple to use a single studded die as a pattern to transfer (pin transfer/doctor blade) adhesive to the substrate. Unbumped die can then be aligned and attached to the pre-patterned sites. Curing of the adhesive may be performed according to any of the protocols illustrated above (i.e. full/partial/uncured).

A further alternative embodiment provides for a mirror image of the die and pin transfer of the adhesive to unbumped die. Any of the three cure options is possible.

Other dispensing techniques are also suitable for use with adhesive conductors; the method selected by the practitioner will depend largely on whether the intended pitch can be achieved by the selected method.

Curing and underfilling (illustrated by FIG. 3A through 3C) after attach are optional steps and may be selected or not, again depending on the design characteristics of the interconnect in question. However if "pure" or "unfilled" underfill is selected, the shrinkage of the underfill functions to compress the connection snugly, eliminating the need for external clamping.

As shown in 3C, the underfilled interconnect 354 features a compression of the first substrate 342, the compliant conductive adhesive 338, and the second substrate 350 assembly.

The invention taught herein provides that underfill may be used to maintain contact pressure. While possibly only a fully cured adhesive would require pressure to maintain electrical contiguity, all direct chip attach methods will benefit from environmental seal supplied by the underfill. Underfill for a conductive adhesive can provide more favorable characteristics that those provided by normal epoxy underfill.

Without filler (solid particles) a clear underfill will shrink more on curing than a comparable filled underfill. Since conductive adhesives are highly filled, shrinkage of surrounding underfill upon curing will place conductive adhesive bumps in compression.

"Un-filled" underfill, due to lower viscosity, quickly wicks under the chip and does not separate. Further, un-filled underfill has a lower modulus and is less likely to cause chip breakage or stress-induced piezo electric phenomenon with large die. Low modulus reduces the need for a void-free underfill, since a low modulus bubble interface is less of a stress riser.

Transparent underfill can be formulated with UV cure mechanisms, to edge tack the die in place. Optional thermal cures can be a secondary operation after testing is complete. Examples of suitable underfills are cyanoacrylates, UV cured epoxy (available from "Loctite"); acrylates such as "Lite-tak" (Loctite) and other similar polymers.

As is evident from the foregoing, the invention provides for direct chip attach to substrate (printed circuit board, land or pad grid array, zincate die, or other substrates) without a carrier and without leads. Uncured adhesive may be applied to the most reliable surface, either chip or board, and the two surfaces pressed together. After assembly, practitioner may proceed with a number of process options, including underfilling and curing, as desired to meet performance characteristics.

Exemplary Protocol

The following is the preferred embodiment according to the inventive method. A 1089 pin Kyocera Ceramic LGA is the substrate upon which silver-silicone adhesive (from Grace Specialty Polymers; specific gravity 3.6) is stencil printed (30 mil pads; 50 mil pitch). The bumped LGA is cured for one hour at 150 degrees Centigrade, under pressure of about 5–10 pounds. The semi-cured bumped LGA is dipped into a thin layer of the silver-silicone paste (wet; doctor-bladed; about 5 mils thick) so that the tips of the bumps are wetted by the paste. The LGA and the bumps thereon are aligned with and placed in contact with the conductive sites of an FR-4 PCB. The LGA-PCB assembly is cured for one hour at 150 degrees Centigrade. Low-viscosity underfill (such as Sealant 350 from Loktite, a UV-curable modified acrylic) is wicked in and then cured by exposure to UV light.

While this invention has been described in the text and the drawings with reference to several preferred embodiments, it is contemplated that various alterations and permutations will become apparent to those skilled in the art upon reading the preceding descriptions and a study of the drawings. It is therefore intended that the scope of the present invention be determined by the appended claims.

We claim:

1. A method of forming compliant adhesive conductive contacts directly on conductive sites of a substrate using a mask having apertures, the apertures configured in the mask to align with the conductive sites, comprising:

providing conductive adhesive that remains compliant when cured;

positioning the mask in proximity to the substrate and aligning the mask with the substrate such that the apertures align with the conductive sites;

loading the mask apertures with the conductive adhesive; and removing the mask, to thereby leave the conductive adhesive directly on the conductive sites to form the compliant adhesive conductive contacts.

2. A method as in claim 1 further comprising partially curing the conductive adhesive prior to mask removal.

3. A method as in claim 1 wherein the conductive adhesive is selected from the group consisting of silicone with a mixture of conductive particles mixed throughout to a volume of greater than about 30%.

4. A method as in claim 1 further comprising:

inspecting an assembly (including the mask, the substrate, and the conductive adhesive) prior to mask removal; and adding conductive adhesive to insufficiently filled mask apertures after inspection.

5. A method as in claim 1 wherein a pitch of conductive adhesive contacts on the substrate is greater than ten mils.

6. A method of electrically connecting a first substrate having a plurality of conductive sites to a second substrate having a plurality of conductive sites comprising:

forming conductive adhesive deposits on selective conductive sites of the first substrate by positioning a mask having a plurality of apertures in proximity to the first substrate and aligning the mask with the first substrate such that the mask apertures align with the selective conductive sites of the first substrate, applying conductive adhesive to the mask such that the conductive adhesive loads the mask apertures, and removing the mask while the conductive adhesive is at least partially uncured;

positioning the conductive adhesive deposits in registry with the conductive sites of the second substrate; and applying pressure external to the first substrate and the second substrate, to thereby form an electrical connection between the first substrate and the second substrate.

7. A method as in claim 6 wherein the pitch of conductive adhesive deposits on the first substrate are in the range of about 10 mils or greater.

8. The method of claim 6, further comprising fully curing the conductive adhesive prior to applying pressure.

9. The method of claim 6, further comprising fully curing the conductive adhesive after applying pressure.

10. The method of claim 6, further comprising selecting an underfill and underfilling between the first substrate and the second substrate after applying pressure.

* * * * *